United States Patent
Swaans

(10) Patent No.: US 11,675,022 B2
(45) Date of Patent: Jun. 13, 2023

(54) SYSTEM, MASTER TEST DEVICE, A SLAVE TEST DEVICE AND METHOD FOR TESTING OF WIRELESS POWER TRANSFER EQUIPMENT HAVING A PLURALITY OF WIRELESS POWER TRANSMITTERS

(71) Applicant: ElectDis AB, Malmö (SE)

(72) Inventor: Laurens Swaans, Malmö (SE)

(73) Assignee: ElectDis AB, Malmö (SE)

( * ) Notice: Subject to any disclaimer, the term of this patent is extended or adjusted under 35 U.S.C. 154(b) by 0 days.

(21) Appl. No.: 17/642,452

(22) PCT Filed: Dec. 14, 2021

(86) PCT No.: PCT/EP2021/085740
§ 371 (c)(1),
(2) Date: Mar. 11, 2022

(87) PCT Pub. No.: WO2022/136027
PCT Pub. Date: Jun. 30, 2022

(65) Prior Publication Data
US 2023/0140156 A1    May 4, 2023

(30) Foreign Application Priority Data
Dec. 22, 2020   (EP) .................................. 20216532

(51) Int. Cl.
*G01R 31/40* (2020.01)
*H04B 17/17* (2015.01)
(Continued)

(52) U.S. Cl.
CPC .............. *G01R 31/40* (2013.01); *H02J 50/40* (2016.02); *H02J 50/60* (2016.02); *H04B 17/17* (2015.01)

(58) Field of Classification Search
CPC .......... G01R 31/40; H02J 50/40; H02J 50/60; H04B 17/17
(Continued)

(56) References Cited

U.S. PATENT DOCUMENTS

2019/0326786 A1    10/2019  Kim et al.
2022/0407563 A1*   12/2022  Swaans ..................... H04L 5/16
(Continued)

FOREIGN PATENT DOCUMENTS

EP       2833515 A1    2/2015
EP       3542475 A1    9/2019
(Continued)

OTHER PUBLICATIONS

PCT; App. No. PCT/EP2021/085740; International Search Report and Written Opinion dated Feb. 24, 2022.

*Primary Examiner* — Giovanni Astacio-Oquendo
(74) *Attorney, Agent, or Firm* — Honigman LLP

(57)    ABSTRACT

A method (200) is disclosed for testing of wireless power transfer equipment (20) that has a plurality of wireless power transmitters (22a-n) adapted for concurrent wireless power transfer to respective wireless power receiver devices (10a, 10a', 10d). The method comprises providing (210) a number of slave test devices (30a-n), and providing (220) a master test device (40) in communicative connection with the slave test devices (30a-n). The method further comprises arranging (230) each slave test device (30a-n) in a position suitable for receiving power from a respective one of the wireless power transmitters (22a-n) of the wireless power transfer equipment (20) under test, and commanding (240; 110a-n), by the master test device (40), the slave test devices (30a-n) to perform respective test procedures (120a-n) upon the respective wireless power transmitters (22a-n) while being in concurrent operation. Finally, the method comprises receiving (250; 140a-n), by the master test device (40),
(Continued)

result data (125*a-n*) from the respective test procedures (120*a-n*) performed by the slave test devices (30*a-n*), and providing (260; 170) an output (45) by the master test device (40), the output (45) being based on the respective result data (125*a-n*) obtained from the slave test devices (30*a-n*).

26 Claims, 9 Drawing Sheets

(51) Int. Cl.
*H02J 50/60* (2016.01)
*H02J 50/40* (2016.01)

(58) Field of Classification Search
USPC .................................. 324/764.01, 537, 500
See application file for complete search history.

(56) References Cited

U.S. PATENT DOCUMENTS

2023/0071605 A1* 3/2023 Melone .................... A47J 47/01
2023/0072541 A1* 3/2023 Hu .......................... H02J 50/60

FOREIGN PATENT DOCUMENTS

EP          3547487  A1    10/2019
EP          3576307  A1    12/2019
WO       2018069478  A1     4/2018

* cited by examiner

200
Method for testing of wireless power transfer equipment 20 having a plurality of wireless power transmitters 22a-n for concurrent wireless power transfer to respective wireless power receiver devices):

---

210
Providing a number of slave test devices 30a-n

---

220
Providing a master test device 40 in communicative connection with the slave test devices 30a-n

---

230
Arranging each slave test device 30a-n in a position suitable for receiving power from any of the wireless power transmitters 24a-n of the wireless power transfer equipment 20 under test

---

240
Commanding, by the master test device 40, the slave test devices 30a-n to perform respective test procedures 120a-n upon respective wireless power transmitters 22a-n while being in concurrent operation

---

250
Receiving, by the master test device 40, result data 125a-n from the respective test procedures 120a-n performed by the slave test devices 30a-n

---

260
Providing an output 45 by the master test device 40, the output 45 being based on the respective result data 125a-n obtained from the slave test devices 30a-n

*Fig 9*

SYSTEM, MASTER TEST DEVICE, A SLAVE TEST DEVICE AND METHOD FOR TESTING OF WIRELESS POWER TRANSFER EQUIPMENT HAVING A PLURALITY OF WIRELESS POWER TRANSMITTERS

CROSS-REFERENCE TO RELATED APPLICATIONS

This application is a 35 USC § 371 United States national stage application of International Application No. PCT/EP2021/085740, filed Dec. 14, 2021, which claims priority to European Patent Application No. 20216532.0, filed Dec. 22, 2020, both of which are incorporated herein by reference.

TECHNICAL FIELD

The present invention generally relates to the field of wireless power transfer, and more specifically to testing of wireless power transfer equipment. Even more specifically, the present invention relates to a system and a method for testing of wireless power transfer equipment that has a plurality of wireless power transmitters adapted to operate concurrently for wireless power transfer. The present invention also relates to a master test device and a slave test device for use therein.

BACKGROUND

Wireless power transfer is growing increasingly popular, for instance for wireless battery charging of mobile devices like mobile terminals, tablet computers, laptop computers, cameras, audio players, electric toothbrushes, wireless headsets and smart watches, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or approaches, including but not limited to the ones mentioned above.

Operation of devices that comply with Qi relies on magnetic induction between planar coils. Two kinds of devices are involved, namely devices that provide wireless power (referred to as base stations or wireless power transmitter devices), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices so as to enjoy wireless battery charging or operational power supply for the mobile device(s) placed on the base station.

This can be seen in FIG. 1 which illustrates a wireless power transmitter device 20' for wireless power transfer to a mobile device 10 (i.e., a wireless power receiver device).

The mobile device 10 may, for instance, be a mobile terminal (e.g. smart phone) 10a, tablet computer 10b (e.g. surf pad), laptop computer 10c, smart watch 10d, camera, audio player, rechargeable toothbrush, wireless headset, or another kind of consumer product or appliance.

Throughout this document, the wireless power transfer will be described as being compliant with the Qi standard by the Wireless Power Consortium, without limitation; hence, the wireless power transmitter device 20 is a base station in the Qi terminology. However, the invention is—as mentioned above—generally applicable also to other wireless power transfer standards or approaches.

The wireless power transmitter device 20' comprises a wireless power transmitter 22 having a wireless power transmitter coil 24 and being controlled by a controller 26. Correspondingly, the mobile device 10 comprises a wireless power receiver 12 having a wireless power receiver coil 14. In operation, the wireless power transmitter device 20' will transfer power wirelessly to the mobile device 10 by way of magnetic induction 18 via the wireless power transmitter coil 24 and wireless power receiver coil 14.

The power received by the wireless power receiver coil 14 will drive a load 16 in the mobile device 10. Typically, the load 16 may be a rechargeable battery, such as a lithium ion battery; hence, the wireless power transmitter device 20' will act as a wireless power charger for the mobile device 10. In another scenario, the load 16 may be electronic circuitry in the mobile device, wherein the wireless power transmitter device 20' will act as a wireless power supply for the mobile device 10.

Throughout this document, wireless charging will be used as an example of wireless power transfer, i.e. a species among a genus, without limitation.

During operation, many different factors affect the quality of the wireless charging. For example, heat will be generated by magnetic induction in the secondary coil of the power receiver as well as from the power transmitter in the base station. If the mobile device and/or the base station are exposed to excessive thermal exposure, several undesired effects may arise, for example damaging vital components in the mobile device. Moreover, the charging efficiency, and thus the charging period needed, may vary depending on the orientation of the power receiver on the base station.

There is therefore a need among different interest groups to test, measure or evaluate the base station and its operating environment when being subjected to wireless power transfer with a power receiver. Such interest groups may for instance involve any of the following: developers, manufacturers or suppliers of mobile devices; developers, manufacturers or suppliers of wireless power transmitter devices; test or compliance entities in the field of wireless power transfer; and test or compliance entities in the field of consumer product safety.

Conventional wireless power charging equipment as illustrated by FIG. 1 performs a 1-to-1 function in the sense that one (1) wireless power transmitter device provides power (energy) to one (1) wireless power receiver device. With the growth of adoption of wireless power transfer into the market, more and more devices become available which will require wireless charging. Accordingly, wireless power charging equipment has begun to appear with which a single wireless power transmitter device can provide power to multiple wireless power receiver devices.

FIG. 2 is a schematic block diagram of a 1-to-many wireless power transmitter device 20 for wireless power transfer to a plurality of mobile devices 10a, 10a', 10d. The wireless power transmitter device 20 comprises a plurality of wireless power transmitters 22a-n, each being adapted for wireless power transfer, as seen at 18a-18n. The wireless power transmitters 22a-n have respective wireless power transmitter coils 24a-n and are controlled by a common controller 26. Accordingly, the plurality of wireless power transmitters 22a-n are adapted to be operated concurrently for wireless power transfer to respective wireless power receiver devices, i.e. respective ones of the mobile devices 10a, 10a', 10d.

So far (status quo), the compliance testing program for the WPC only performs testing functionality for wireless power transmitter devices in a 1-to-1 capacity. This means that the compliance testing only verifies the performance and compliance of the equipment while providing power to a single test device acting as a wireless power receiver.

The present inventor has realized that a wireless power transmitter device that supports 1-to-many charging can suffer from performance degradation when it is providing power to several devices at the same time. It is essential that wireless charging equipment carrying the Qi logo (as controlled by the WPC) is compliant under all possible operating conditions. One example of such influence can be interference on the communication channel experienced by the wireless power transmitter device or a first wireless power receiver device due to cross-talk or noise generated by a second wireless power receiver device.

Another example can be the heating up of one part of the wireless power transmitter device or of a first wireless power receiver device, that may influence the behavior of a second wireless power receiver device.

As indicated at 19 and 19' in FIG. 2, these problems may occur for instance because of a limited distance between adjacent wireless power transmitters 22a-n or between wireless power receiver devices 10, 10'a, 10d.

Yet another example can be that the wireless power transmitter device may not be capable to provide the required power when multiple wireless power receiver device are being charged; not just average powers, but also regarding temporary transients where power demands can spike for a brief moment.

Testing equipment for WPC compliance testing is highly technical and expensive equipment. An easy solution would be to use two (2) pieces of test equipment and run several tests in parallel; that would enable testing of a wireless power transmitter device that can provide power to two wireless power receiver devices. This is however not a desirable or scalable approach due to the high cost involved, especially when considering wireless power transmitter devices that can charge more than two wireless power receiver devices, say five or ten.

SUMMARY

It is an object of the invention to offer improvements in testing of wireless power transfer equipment and to eliminate or mitigate one or more of the problems identified above.

A first inventive aspect is a system for testing of wireless power transfer equipment that has a plurality of wireless power transmitters adapted for concurrent wireless power transfer to respective wireless power receiver devices. The system comprises a master test device with a local data communication interface, a master controller, and an output unit. The system further comprises a number of slave test devices. Each slave test device has a local data communication interface being adapted for data communication with the master test device, a wireless power receiver, and a local controller configured for performing a wireless power transfer test procedure upon any of the wireless power transmitters of the wireless power transfer equipment under test.

In this inventive system, the master test device is configured to communicate via its local data communication interface with the slave test devices. The master controller of the master test device is configured to command the slave test devices to perform their respective test procedures upon respective ones of the wireless power transmitters of the wireless power transfer equipment while being in concurrent operation under test, receive result data from the respective test procedures performed by the slave test devices, and provide an output by the output unit of the master test device. The output is based on the respective result data obtained from the slave test devices.

A second inventive aspect is a method for testing of wireless power transfer equipment of a type that has a plurality of wireless power transmitters adapted for concurrent wireless power transfer to respective wireless power receiver devices. The method involves:

providing a number of slave test devices;

providing a master test device in communicative connection with the slave test devices;

arranging each slave test device in a position suitable for receiving power from a respective one of the wireless power transmitters of the wireless power transfer equipment under test;

commanding, by the master test device, the slave test devices to perform respective test procedures upon the respective wireless power transmitters while being in concurrent operation;

receiving, by the master test device, result data from the respective test procedures performed by the slave test devices; and providing an output by the master test device, the output being based on the respective result data obtained from the slave test devices.

A third inventive aspect is a master test device for testing of wireless power transfer equipment that has a plurality of wireless power transmitters adapted for concurrent wireless power transfer to respective wireless power receiver devices. The master test device comprises a local data communication interface, a master controller, and an output unit. The master test device is configured to communicate with a plurality of slave test devices via the local data communication interface. The master controller of the master test device is configured to command the slave test devices to perform respective wireless power transfer test procedures upon respective ones of the wireless power transmitters of the wireless power transfer equipment while being in concurrent operation under test, receive result data from the respective test procedures performed by the slave test devices, and provide an output by the output unit of the master test device. The output is based on the respective result data obtained from the slave test devices.

A fourth inventive aspect is a slave test device for testing of wireless power transfer equipment that has a plurality of wireless power transmitters adapted for concurrent wireless power transfer to respective wireless power receiver devices. The slave test device comprises a local data communication interface being adapted for data communication with a master test device, a wireless power receiver, and a local controller configured for performing a wireless power transfer test procedure pertaining to any of the wireless power transmitters of the wireless power transfer equipment under test. The slave test device is configured to communicate via its local data communication interface with the master test device. The local controller of the slave test device is configured to receive a command from the master test device, perform the wireless power transfer test procedure upon one of the wireless power transmitters, generate result data from the performance of the wireless power transfer test procedure, and transmit the result data to the master test device.

The number of slave test devices used in this invention may be an arbitrary number of slave test devices, including a case where only a single slave test device is used. Advantageously, however, at least two slave test devices are used, wherein in such a case the locution "a number of slave test devices" will mean "a plurality of slave test devices". If only a single slave test device is used, it will perform its wireless power transfer test procedure on one of the wireless power transmitters of the wireless power transfer equipment under test. If a plurality of slave test devices are used, the slave test devices will perform their respective wireless power transfer test procedures on respective ones of the wireless power transmitters of the wireless power transfer equipment under test.

The fact that the output is based on the respective result data obtained from the slave test devices does not in any way preclude that the output is also affected or derived from other information, including test result data obtained by the master test device itself. Some of the disclosed embodiments have a main probe device for use directly by the master test device to this end.

As will have been understood from the above, an inventive insight by the present inventor is the benefit that comes from being able to monitor and control both advanced compliance test equipment (the master test device) and one or more additional devices (the slave test devices) when performing compliance tests on wireless power transfer equipment having a plurality of wireless power transmitters. This is especially so when time-critical events are being monitored and correlation between events on the separate wireless power transmitters needs to be proven. This is where the invention comes in. The invention comprises an overall testing system that makes use of both an advanced compliance test tool (the master test device) as well as a number of less advanced slave test devices that can connect to the advanced compliance test tool. The master test device is a centralized intelligence in the system that controls (or sends information for the purpose of control) to all connected equipment based on observations (or received information on observations) on all equipment. The slave test devices are capable of communicating with the master test device and act upon instructions from that device while reporting back measurement results. Such a configuration can turn any standalone auxiliary test device into an add-on to the complete multi-device test setup, all is needed is a communication interface (like an API) that allows it to act as a slave test device by communicating with the master test device acting as a host in the test setup.

As an example, the master test device can monitor with extremely high accuracy the quality of the communication channel by using, for instance, error rates or bit error rates. Then, while it is monitoring this parameter on one charging interface, it can manipulate the level of interference by adjusting the communication parameters of the slave test device(s). Using the knowledge on all power receiver devices active on the DUT (the power transmitter product), the test system can look for specific worst-case use by, for instance, perturb-and-observe algorithms to find any possible problem areas. Such a solution would help product manufacturers find weaknesses in their product and make improvements and it would help standardization organizations by better test equipment, automated to find worst-case conditions improving both testing efficiency as well as effectivity.

The scope of parameters that can be measured, observed, and influenced is not restricted to communication, but covers all fields from power electronics and electromagnetics to user experience and safety. This includes power measurements, magnetic field strengths, but also temperatures of the device itself or of any foreign objects as used to evaluate the safety performance of wireless power products.

Such combination of capabilities then opens the doors to make use of machine learning and artificial intelligence techniques to improve product design and research in wireless power transfer. Monitoring the effects that one part of the system has on the remaining parts adds significant value to the designers and manufacturers of wireless power transfer products.

One goal of the system may even be to provide a fully autonomous solution that can search for problem areas in different performance aspects of wireless charging systems. A key then is that the system itself monitors all its involved devices (including the slave test devices) and can modify its behavior based on the observations. This allows a systematic evaluation of a multitude of conditions and test scenarios to evaluate the impact on the DUT. Doing this in an automated way (without the need of intervention by an operator) allows for much faster response times and much higher resolution. Moreover, the system can observe and compare dynamic patterns (studying transient responses) in addition to static operating conditions.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc.]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Objects, features and advantages of embodiments of the invention will appear from the following detailed description, reference being made to the accompanying drawings.

FIG. 9 is a schematic flowchart diagram of a method for testing of 1-to-many wireless power transfer equipment.

DETAILED DESCRIPTION

Figure 1:
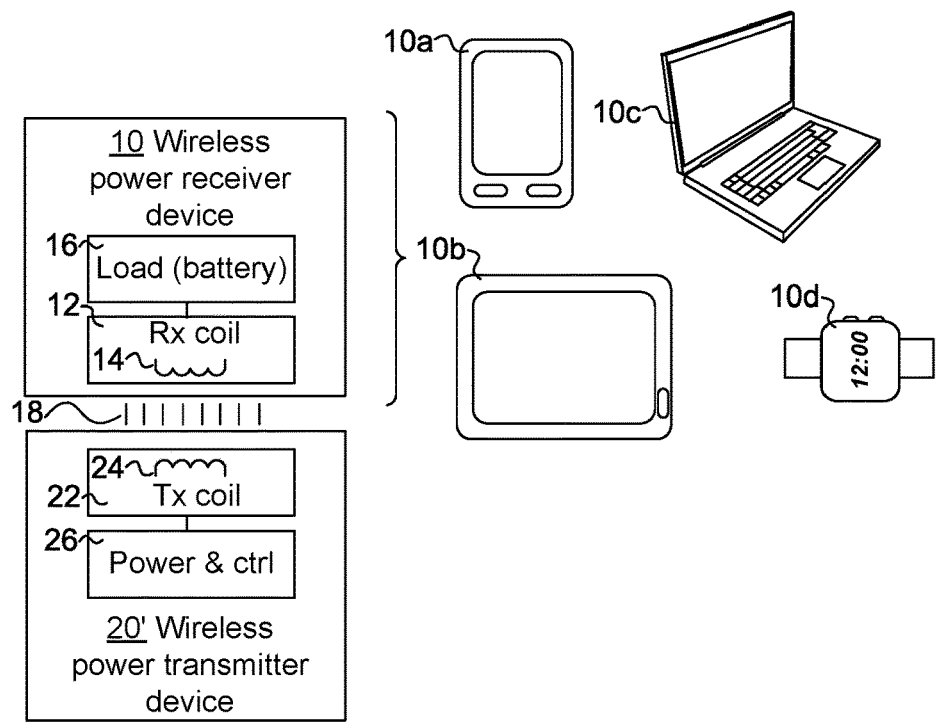
FIG. 1 is a schematic block diagram of a 1-to-1 wireless power transmitter device for wireless power transfer to a single mobile device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements. Elements illustrated as hatched boxes are generally to be seen as optional in the particular drawing in which they appear.

Figure 2:
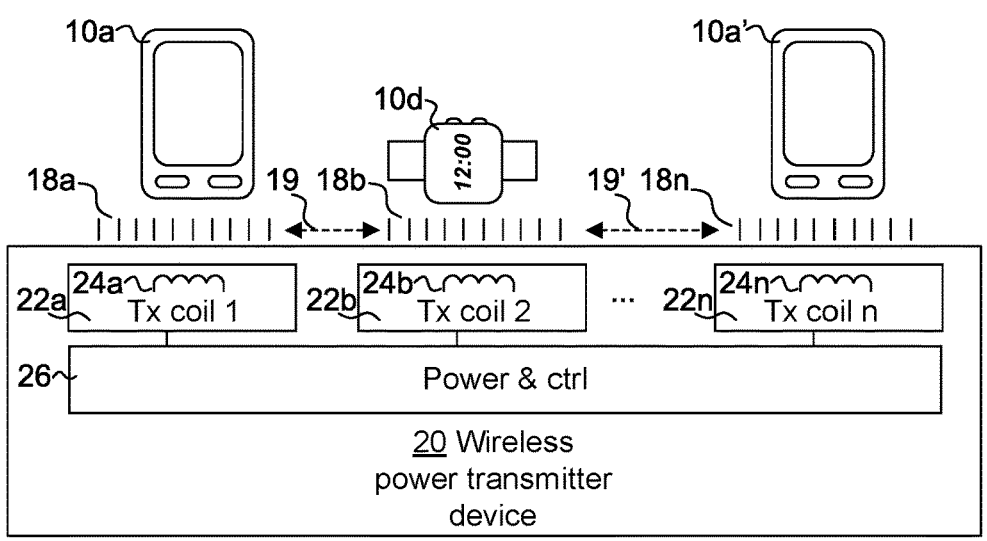
FIG. 2 is a schematic block diagram of a 1-to-many wireless power transmitter device for wireless power transfer to a plurality of mobile devices.
Figure 3:
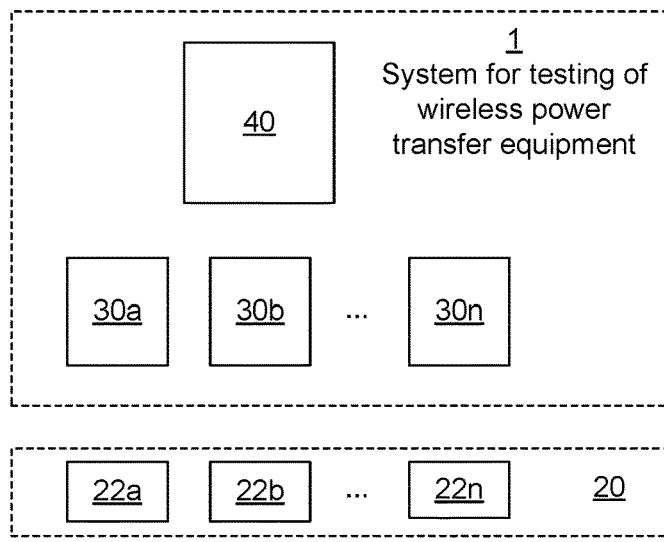
FIG. 3 is a schematic illustration of the composition of a system for testing of wireless power transfer equipment that has a plurality of wireless power transmitters adapted for wireless power transfer, such as a 1-to-many wireless power transmitter device like the one shown in FIG. 2.

FIG. 3 illustrates the overall composition of a system 1 for testing of wireless power transfer equipment 20 that has a plurality of wireless power transmitters adapted for wireless power transfer, i.e. 1-to-many wireless power transfer equipment. Hence, the system 1 may, for instance, be used for testing of a 1-to-many wireless power transmitter device 20 like the one shown in FIG. 2, having a plurality of wireless power transmitters 22*a-n* adapted for concurrent (parallel) wireless power transfer to respective wireless power receiver devices such as, for instance, mobile devices 10*a*, 10*a'*, 10*d* in FIG. 2. For the avoidance of any doubt, please note that the wireless power receiver devices of, for instance, FIG. 2 are not part of the system 1 for testing. Instead, the system 1 will test the wireless power transfer equipment 20 with its plurality of wireless power transmitters with respect to its ability to provide wireless power, which in normal (non-test) operation would mean providing wireless power to such wireless power receiver devices concurrently. Accordingly, the testing may, for instance seek to assess or verify the ability of the wireless power transmitter device 20 with its plurality of wireless power transmitters 22*a-n* to comply with a wireless power transfer standard, such as Qi by the WPC.

Alternatively, the system 1 may be used for similar testing of a plurality of stand-alone 1-1 wireless power transmitter devices, each having a respective wireless power transmitter 22*a-n*, for instance when the stand-alone 1-to-1 wireless power transmitter devices operate in close proximity of each other (a.k.a. co-existence testing).

A further use of the system 1 is to test a plurality of 1-to-n wireless power transmitter devices that operate jointly together, such as five 1-to-2 wireless power transmitter devices, or two 1-to-5 wireless power transmitter devices.

The system 1 has two types of principal components in a hierarchical configuration: a master test device 40, and a number of slave test devices 30*a-n*. The slave test devices 30*a-n* are controlled by the master test device 40 to perform respective tests upon respective ones of the wireless power transmitters of the wireless power transfer equipment 20 while being in concurrent (parallel) operation under test, and to report test result data back to the master test device 40. The master test device 40 may use the reported test result data from the slave test devices 30*a-n* when concluding on overall and/or detailed test results.

Figure 4:
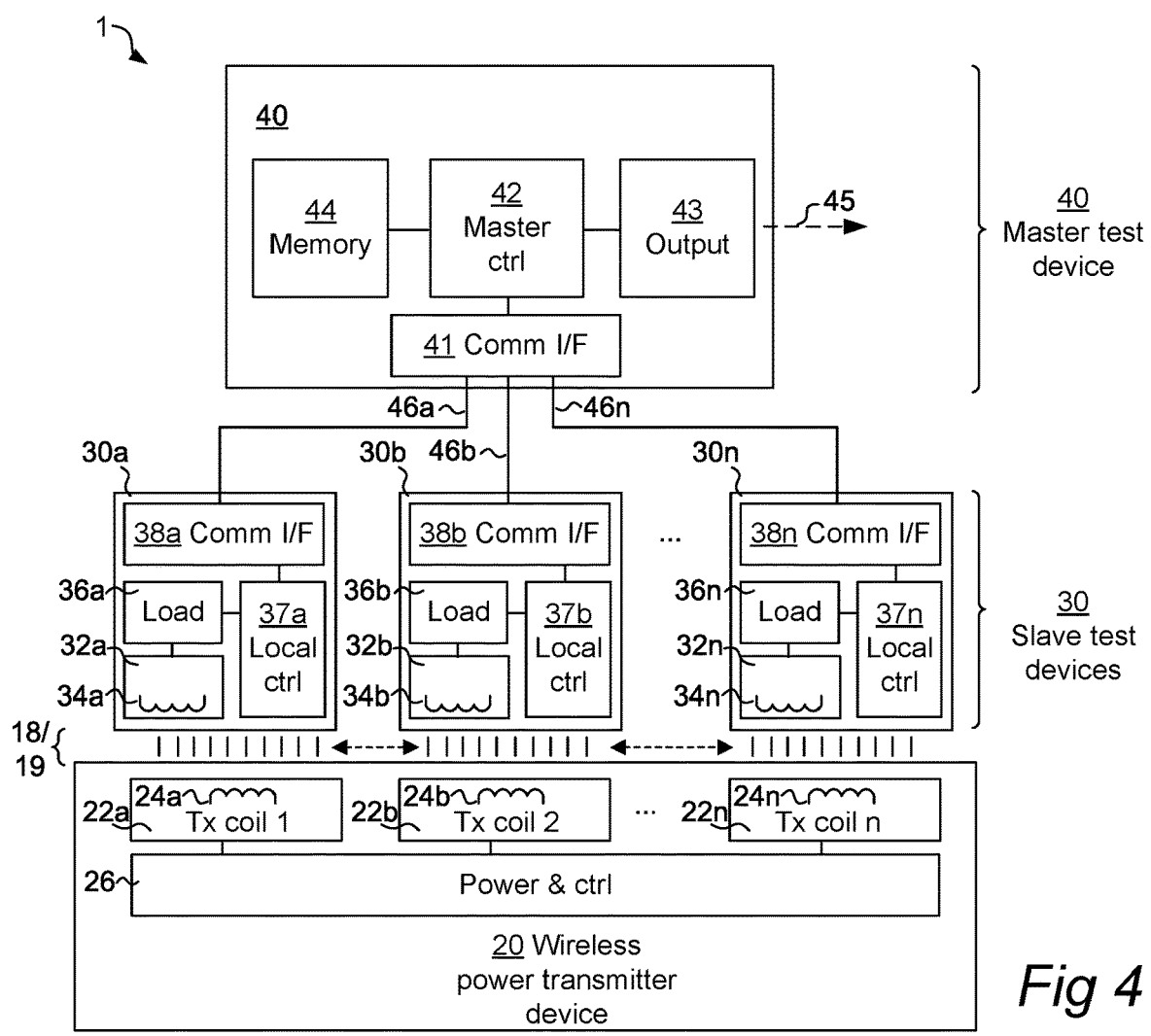
FIG. 4 is a detailed block diagram of a first embodiment of the system for testing of a 1-to-many wireless power transmitter device.

FIG. 4 is a detailed block diagram of a first embodiment of the system 1 for testing of wireless power transfer equipment in the form of a 1-to-many wireless power transmitter device 20 having a plurality of wireless power transmitters 22*a-n* adapted for wireless power transfer. As already mentioned in conjunction with FIG. 3, the system 1 comprises a master test device 40 and a number of slave test devices 30*a-n*. The wireless power transmitter device 20 may, for instance, be like the one previously described for FIG. 2.

The master test device 40 has a local data communication interface 41, a master controller 42 with an associated memory 44, and an output unit 43.

Each slave test device 30*a-n* has a local data communication interface 38*a-n* being adapted for data communication with the master test device 40. As seen at 46*a-n* in FIG. 4, the master test device 40 is configured to communicate via its local data communication interface 41 with the slave test devices 30*a-n*, and the slave test devices 30*a-n* will use their respective local data communication interfaces 38*a-n* for this communication.

Each slave test device 30*a-n* also has a wireless power receiver 32*a-n* with a wireless power receiver coil 34*a-n*, a local controller 37*a-n* and a suitable load 36*a-n*. The load 36*a-n* may be provided to handle excess power received by the wireless power receiver coil 34*a-n*. For instance, a suitably dimensioned resistor may be used. The load 36*a-n* may be controllable in some embodiments.

Figure 7:
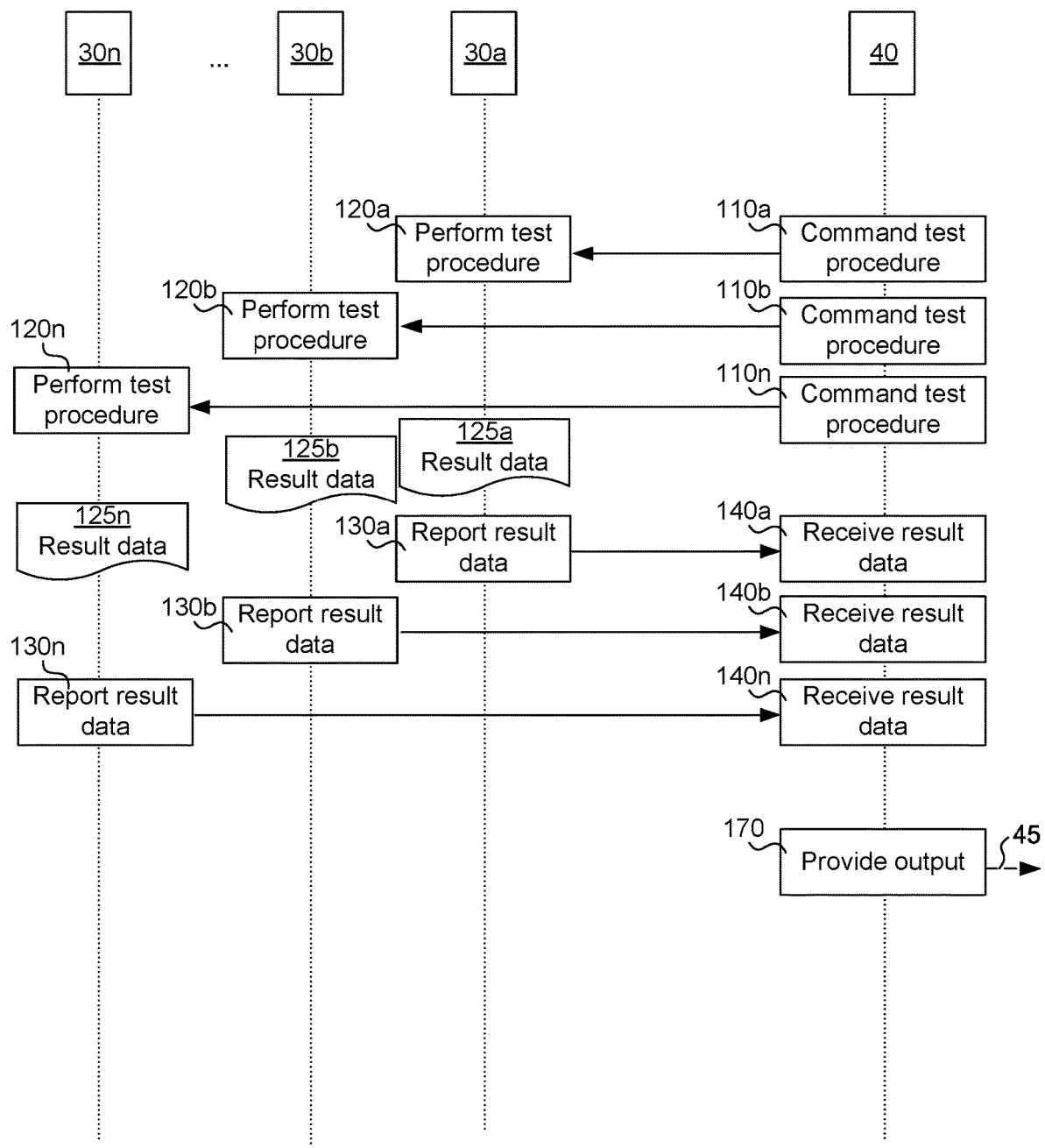
FIG. 7 is a schematic flowchart diagram illustrating the operation of the system for testing of a 1-to-many wireless power transmitter device according to FIG. 4, 5 or 6.

Reference is also made to FIG. 7, being a schematic flowchart diagram that illustrates the operation of the system 1 for testing of the 1-to-many wireless power transmitter device 20. The local controller 37*a-n* of each slave test device 30*a-n* is configured for performing a wireless power transfer test procedure 120*a-n* upon any of the wireless power transmitters 22*a-n* of the wireless power transmitter device 20 under test. In a typical situation where there are two or more slave test devices 30*a-n*, the slave test device 30*a-n* are configured for performing respective wireless power transfer test procedures 120*a-n* upon respective ones of the wireless power transmitters 22*a-n* of the wireless power transmitter device 20 under test. This may involve the first slave test device 30*a* performing a wireless power transfer test procedure 120*a* upon the first wireless power transmitter 22*a*, the second slave test device 30*b* performing a wireless power transfer test procedure 120*b* upon the second wireless power transmitter 22*b*, and so on.

As can be seen in FIG. 7, the master controller 42 of the master test device 40 is configured by way of communication 46*a-n* to command 110*a-n* the slave test devices 30*a-n* to perform their respective test procedures 120*a-n* upon the respective wireless power transmitters 22*a-n* while the wireless power transmitters 22*a-n* are in concurrent operation. The master controller 42 of the master test device 40 is further configured to receive 140*a-n* result data 125*a-n* from the respective test procedures 120*a-n* performed by the slave test devices 30*a-n*, and to provide 170 an output 45 by the output unit 43 of the master test device 40. The output 45 is based at least in part on the respective result data 125a-n obtained from the slave test devices 30a-n. As will be explained further with reference to FIG. 5, the master test device 40 may have its own main probe device 31 to produce additional result data that may also be taken into account when producing the output 45.

The local data communication interfaces 41 and 38a-n may be of any suitable type, including simple wiring, a serial interface such as USB, a wireless interface such as Bluetooth of WiFi, etc., and combinations thereof. Of course, the different slave devices 30a-n may use different types of local data communication interfaces 38a-n to communicate with the master test device 40, such that one of the slave devices 30a-n connects to the master test device 40 by, for instance, USB whereas another one of the slave devices 30a-n connects to the master test device 40 by, for instance, Bluetooth.

The master controller 42 of the master test device 40 and, likewise, the local controllers 37a-n of the slave test devices 30a-n may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC). The associated memory 44 of the master controller 42 and, likewise, associated memories of the local controllers 37a-n may be implemented using any commonly known technology for computer-readable memories such as ROM, RAM, SRAM, DRAM, FLASH, DDR, SDRAM or some other memory technology. The memories may be configured to store data relating to the test procedures. The memories may further be configured to store program code (software or firmware) defining the test procedures as well as other functionality performed by the respective devices 40 and 30a-n, as described in this document.

The output device 43 of the the master test device 40 may comprise or be part of a local user interface (e.g. a display), a local data communication interface, a network communication interface, or any combination thereof. The output 45 may involve presentation of information, generation of visual and/or audible feedback such as alarms or confirmation, or communication of information to an external local or remote device.

The system 1 may be used in many different situations. In one or more embodiments of the system 1, the master controller 42 of the master test device 40 is further configured to analyze 150 (see FIG. 8) the respective result data 125a-n obtained from the slave test devices 30a-n, and to derive a combined test result representing an overall test outcome for the wireless power transmitter device 20 under test. The combined test result may be provided as output 45. A combined test result will be beneficial to users (e.g. operators) of the system 1, since it will give an overall indication of a pass or failed test status for the device under test. i.e. the wireless power transmitter device 20.

In these or other embodiments of the system 1, the master controller 42 of the master test device 40 is further configured to analyze 150 the respective result data 125a-n obtained from the slave test devices 30a-n, and to derive an individual test outcome for a particular wireless power transmitter 22a of the wireless power transmitter device 20 under test. The individual test outcome may be provided as output 45. An individual test outcome will serve as useful information to users of the system 1, since it will give a detailed indication of how well individual wireless power transmitters of the wireless power transmitter device 20 perform when subjected to, for instance, a compliance test of the wireless power transmitter device 20.

Additionally or alternatively, the master controller 42 of the master test device 40 is further configured to analyze 150 the respective result data 125a-n obtained from the slave test devices 30a-n, and to identify a first particular wireless power transmitter 22a of the wireless power transmitter device 20 under test as being a cause of an individual test outcome of a second particular wireless power transmitter 22b under test.

This may be done by way of a process of systematic performance analysis. For example, a series of experiments may be run where in every iteration the same test is applied to the second transmitter 22b whereas some parameter change (e.g. increase in a signal level) is iteratively applied to the first transmitter 22a. By correlating the outcome of the tests on the second transmitter 22b with the parameter changed for the first transmitter 22a, the first transmitter 22a can be identified as a cause of an individual test outcome of the second transmitter 22b. This process can become more and more convoluted as it is fully automated, and as many slave devices as possible may be added to allow identification of a correlation that would not be possible without such a test system.

Accordingly, the master controller 42 of the master test device 40 may be configured to cause the slave test devices 30a-n to perform their respective test procedures 120a-n iteratively, such that the test procedure 120a of a first particular wireless power transmitter 22a of the wireless power transfer equipment 20 under test is performed with an iterative change in a test parameter whereas the test procedure 120b of a second particular wireless power transmitter 22b of the wireless power transfer equipment 20 under test is performed with no such change in the test parameter. The master controller 42 of the master test device 40 may be further configured to analyze 150 the respective result data 125a-n obtained from the slave test devices 30a-n to correlate the test outcomes of the first and second particular wireless power transmitters 22a, 22b, and to identify, from the correlation, the first particular wireless power transmitter 22a as being a cause of the test outcome of the second particular wireless power transmitter 22b.

This will be beneficial to users of the system 1, since it will help in understanding the source of a malfunction or failure of the wireless power transmitter device 20 to pass a compliance test.

Figure 8:
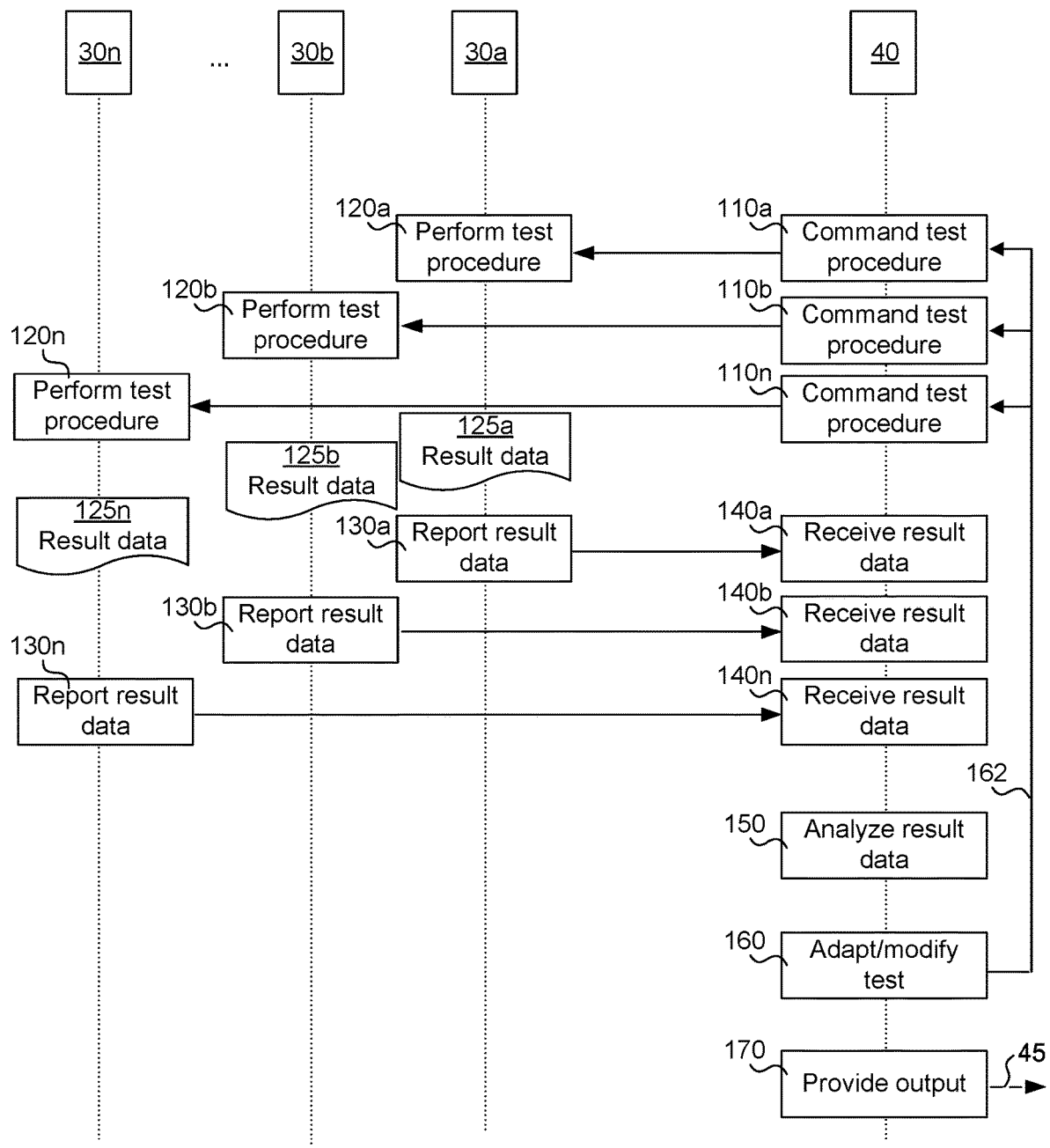
FIG. 8 is an alternative schematic flowchart diagram illustrating the operation of the system for testing of a 1-to-many wireless power transmitter device according to FIG. 4, 5 or 6.

As seen in FIG. 8, some beneficial embodiments involve the following. The master controller 42 of the master test device 40 is further configured to analyze 150 the respective result data 125a-n obtained from the slave test devices 30a-n. The master controller 42 then determines 160 a modification or adaptation of the test procedure(s) 120a-n of one or more of the slave test devices 30a-n in view of the result data 125a-n obtained. The master controller 42 causes, at 162 in FIG. 8, the one or more of the slave test devices 30a-n to perform their modified or adapted test procedures 120a-n, for instance by providing revised instructions to those slave devices the next time the master controller 42 of the master test device 40 sends commands 110a-n to the slave test devices 30a-n about performing their respective test procedures 120a-n. This will facilitate adaptive or learning-based tests and therefore allow for improvements in the test accuracy and also adaptation of the tests to new or modified equipment or test cases.

Still other beneficial embodiments involve the following. The master controller 42 of the master test device 40 is further configured for testing or measuring a user feedback or indication given by the wireless power transmitter device 20 when a problem state occurs in connection with the transfer of wireless power by one of the wireless power transmitters 22*a*-*n*, as detected by one of the slave test devices 30*a*-*n* performing its test procedure 120*a*-*n*. This is an important ability to test which is made possible for such embodiments.

Figure 5:
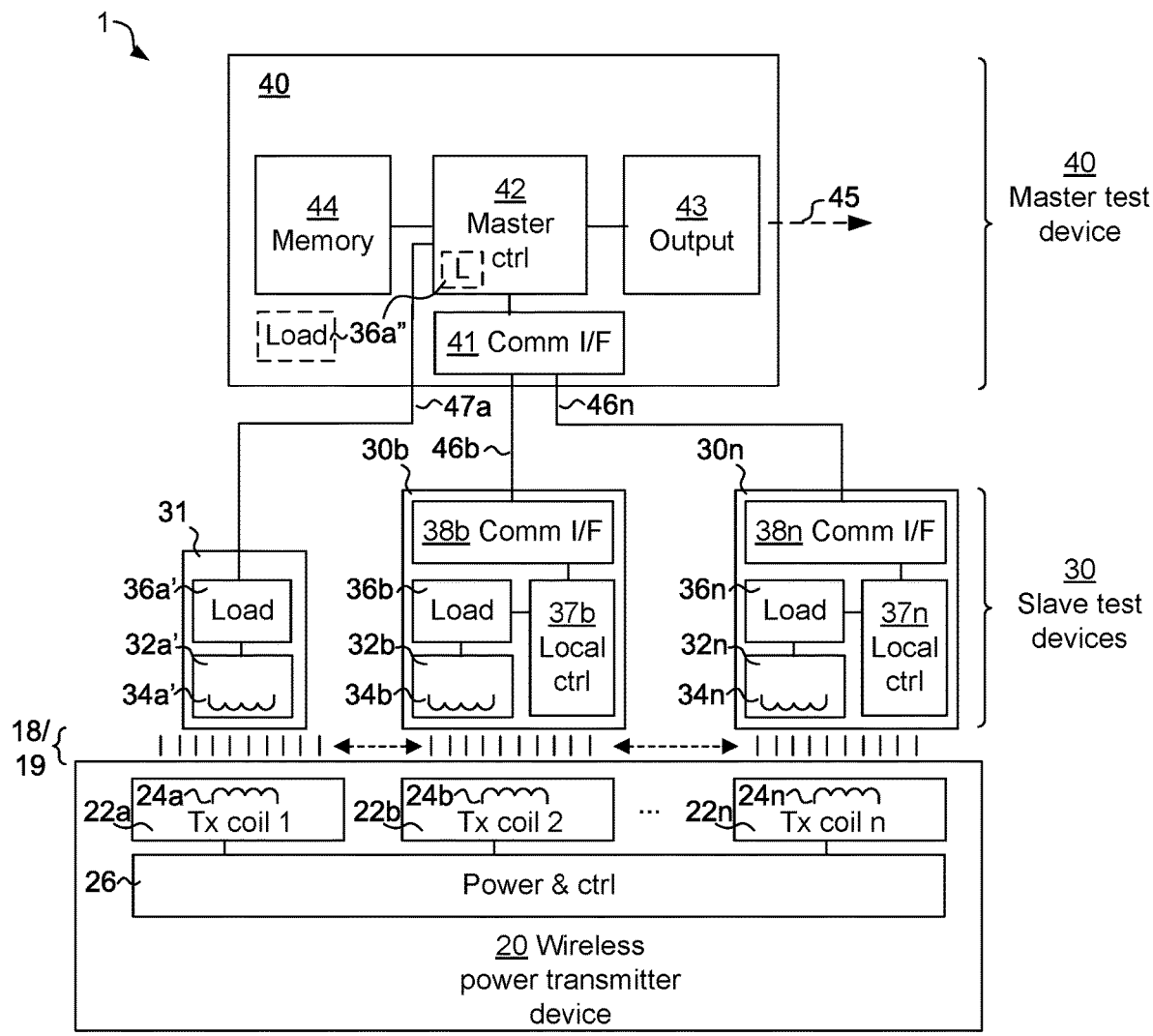
FIG. 5 is a detailed block diagram of a second embodiment of the system for testing of a 1-to-many wireless power transmitter device.

Reference is now made to FIG. 5 which is a detailed block diagram of a second embodiment of the system 1 for testing of a 1-to-many wireless power transmitter device 20. The difference over the first embodiment in FIG. 4 is that in FIG. 5, a main probe device 31 is provided which has a wireless power receiver 32*a*', receiver coil 34*a*' and load 36*a*', and is under direct operative control by the master controller 42 of the master test device 40 to perform a wireless power transfer test procedure 120*a* upon any one of the wireless power transmitters 22*a*-*n* of the wireless power transmitter device 20 under test. This will facilitate for the master test device 40 to act as the centralized intelligence in and controller of the test setup. The load 36' for the probe device 31 may alternatively be located in the master test device 40, or even in the master controller 42 thereof, as is indicated at 36*a*".

It is recalled that the number of slave test devices 30*a*-*n* used in this invention may be an arbitrary number of slave test devices, including a case where only a single slave test device is used. Advantageously, however, at least two slave test devices are used, wherein in such a case the locution "a number of slave test devices" will mean "a plurality of slave test devices". However, particularly for embodiments with a main probe device 31 like in FIG. 6, it may suffice to only have a single slave test device 30*a* in addition to the main probe device 31.

Figure 6:
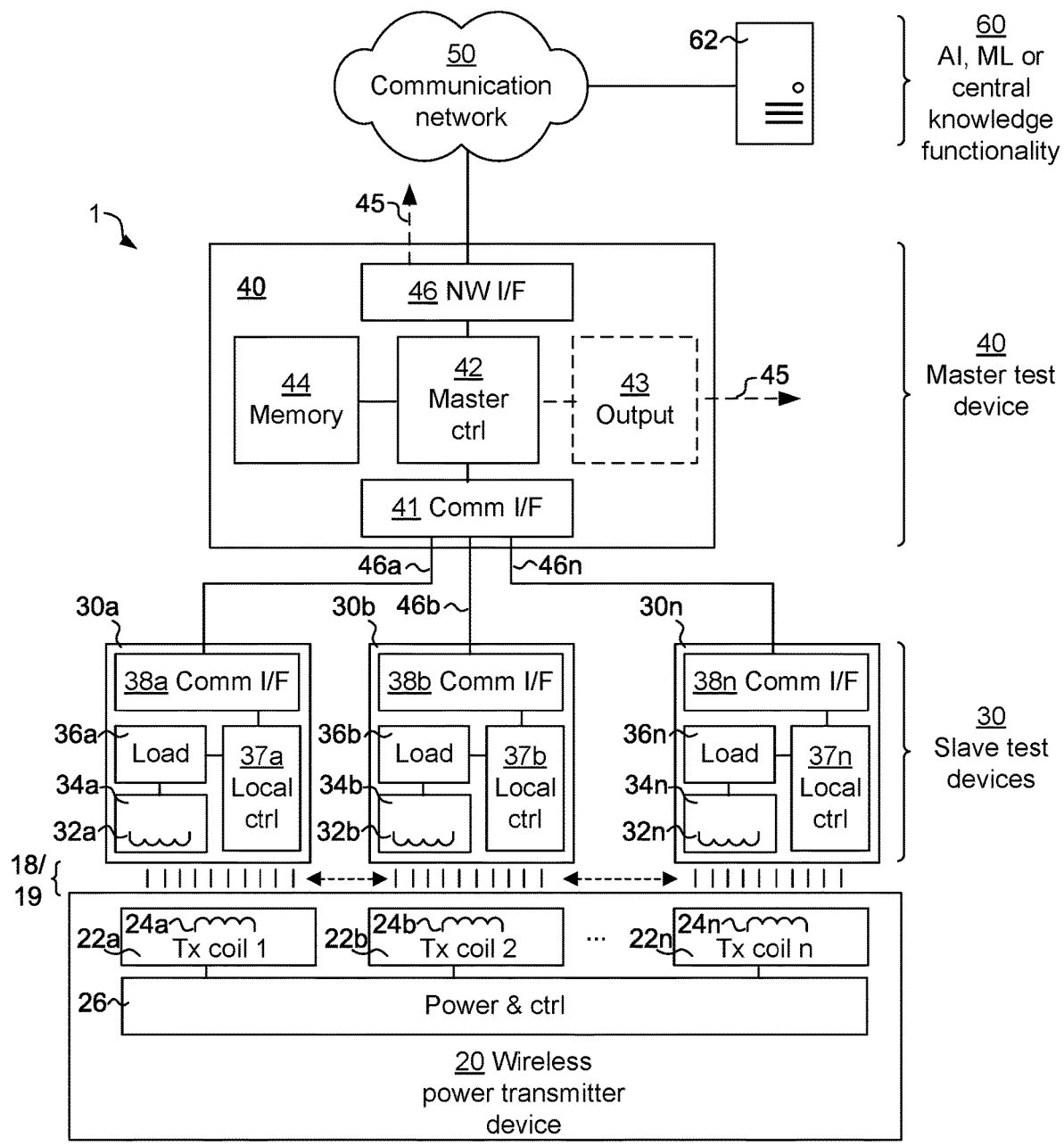
FIG. 6 is a detailed block diagram of a third embodiment of the system for testing of a 1-to-many wireless power transmitter device.

FIG. 6 is a detailed block diagram of a third embodiment of the system 1 for testing of a 1-to-many wireless power transmitter device 20. There is a difference over the first and second embodiments in FIG. 4 and FIG. 5 in the provision of a network communication interface 46 for the master test device 40. Thanks to this, the master controller 42 of the master test device 40 is further configured for communicating with remote artificial intelligence, machine learning or central knowledge functionality 60 to transmit information to the remote artificial intelligence, machine learning or central knowledge functionality 60, which includes remote computing resources 62. The transmitted information may include or be derived from the respective result data 125*a*-*n* obtained from the slave test devices 30*a*-*n*, including the main probe device 31 when applicable. This will accelerate product development as well as trouble shooting for a product or series of products as a whole, since it may make it easier to detect and conclude on errors, anomalies or malfunctions that only occur infrequently and/or only for a fraction of the product samples.

Additionally or alternatively, the master controller 42 of the master test device 40 may be further configured for communicating with the remote artificial intelligence, machine learning or central knowledge functionality 60 to receive information from the remote artificial intelligence, machine learning or central knowledge functionality 60. The received information may serve for updating one, some or all of the respective test procedures 120*a*-*n* of the slave test devices 30*a*-*n*, and/or the main probe device 31 when applicable. This may allow further refinements of the test procedures of the system 1 and, in particular, gain from knowledge or experience that has been obtained from other tests and test systems performed around the world.

In embodiments like in FIG. 6 where the master test device 40 comprises a network communication interface 46, such network communication interface 46 may also represent the aforementioned output unit 43. Hence, the output 45 which is based on the respective result data 125*a*-*n* obtained from the slave test devices 30*a*-*n*, and from the main probe device 31 when applicable, may be made by communicating the output 45 to a network resource over the network communication interface 46.

Some different examples on test procedures performable by the slave test devices will now be discussed.

A first example is testing of communication quality during wireless power transfer. Thus, at least one of the test procedures 120*a*-*n* of the slave test devices 30*a*-*n* involves testing or measuring a parameter indicative of a quality of inductive communication between a slave test device 30*a*-*n* and a wireless power transmitter 22*a*-*n* of the wireless power transmitter device 20 under test, according to a communication protocol (for instance pursuant to Qi) for controlling a wireless power transfer session.

A second example is testing of magnetic field strength. In this case, at least one of the test procedures 120*a*-*n* of the slave test devices 30*a*-*n* involves testing or measuring a parameter indicative of a magnetic field strength during wireless power transfer by a wireless power transmitter 22*a*-*n* of the wireless power transmitter device 20 under test.

A third example is testing of power transfer efficiency. Here, at least one of the test procedures 120*a*-*n* of the slave test devices 30*a*-*n* involves testing or measuring a parameter indicative of the efficiency of wireless power transfer by a wireless power transmitter 22*a*-*n* of the wireless power transmitter device 20 under test.

A fourth example is testing of temperature. Accordingly, at least one of the test procedures 120*a*-*n* of the slave test devices 30*a*-*n* involves testing or measuring a parameter indicative of a temperature during wireless power transfer by a wireless power transmitter 22*a*-*n* of the wireless power transmitter device 20 under test.

A fifth example is testing of the ability to detect a foreign object. To this end, at least one of the test procedures 120*a*-*n* of the slave test devices 30*a*-*n* involves testing or measuring a capability of detecting the presence of a foreign object during wireless power transfer by a wireless power transmitter 22*a*-*n* of the wireless power transmitter device 20 under test.

A sixth example is to move the physical position of one or more of the slave test devices 30*a*-*n* with respect to any of the wireless power transmitters 22*a*-*n* and verify the impact of such physical movements in various performance indicators.

As the skilled person will realize, these are just non-limiting examples of test procedures performable by slave test devices in the system according to the present invention.

FIG. 9 is a schematic flowchart diagram of a method 200 for testing of 1-to-many wireless power transfer equipment, such as the wireless power transmitter device 20 as described above. The method is essentially the procedural equivalent of the functionality performed by the system 1 and any or all of its embodiments as described in this document.

A first step 210 involves providing a number of slave test devices 30*a*-*n*.

A second step 220 involves providing a master test device 40 in communicative connection with the slave test devices 30*a*-*n*.

A third step 230 involves arranging each slave test device 30*a*-*n* in a position suitable for receiving power from a respective one of the wireless power transmitters 22*a-n* of the wireless power transfer equipment 20 under test.

A fourth step 240 involves commanding (also see 110*a-n* in FIG. 7 and FIG. 8), by the master test device 40, the slave test devices 30*a-n* to perform respective test procedures 120*a-n* upon the respective wireless power transmitters 22*a-n*.

A fifth step 250 involves receiving (also see 140*a-n* in FIG. 7 and FIG. 8), by the master test device 40, result data 125*a-n* from the respective test procedures 120*a-n* performed by the slave test devices 30*a-n*.

A sixth step 260 then involves providing (also see 170 in FIG. 7 and FIG. 8) an output 45 by the master test device 40, the output 45 being based on the respective result data 125*a-n* obtained from the slave test devices 30*a-n*.

Other than the steps recited above, the method 200 may comprise any functional step that corresponds to the functionality of the system 1, master test device 40, slave test devices 30*a-n* and main probe device 31 as described throughout this document.

Two example use cases will be described below where the wireless power transmitter device 20 under test (the DUT) comprises a three-device charger. The particular test concepts in these examples are:

A. To see if the DUT can maintain a minimum quality level of the in-band communication channel. Specifically of interest is how the changing of operating points on the various charging spots and changing of modulation depth will influence the communication quality.

B. To see if the DUT can maintain safety requirements in terms of Foreign Object Detection while the slave test devices stress the DUT in operating conditions.

In this situation the master test device 40 contains highly accurate compliance test equipment that has any needed functionality and measurements built in. Then there are two slave test devices used to enable all three charging spots on the DUT simultaneously. The slave test devices have the following features/functions that can be controlled by the master test device 40 through instructions over their data connection:

1. Report the actual operating point (rectified voltage and current).
2. Report the amount of received power.
3. Provide a bit error rate of the incoming communication (on the wireless power channel), i.e. it can measure one or more parameters indicative of the communication quality.
4. Control its load resistance (i.e. the amount of power it is dissipating).
5. Adjust its target operating point (rectified voltage and current).

The master test device 40 can perform all functions and features that are required from compliance test equipment. The master test device 40 can emulate various wireless power receiver reference designs and can do this by moving through different operating points MOP-1 through MOP-n. An operating point can be seen as a combination of DC voltage and DC current on the receiver. One way of changing operating points is by changing the load resistance; another way is by changing the DC voltage. The collection of all operating points that a specific Reference Receiver can operate under is called the Operating Space for that receiver.

Test concept A is illustrated further in FIGS. 10A-B which will be described in more detail below. Test concept B can essentially be the same with the exception that the master test device 40 does not measure BER but instead measures FOD performance and can be instructed to adjust the settings relevant for FOD testing.

Figure 10A:
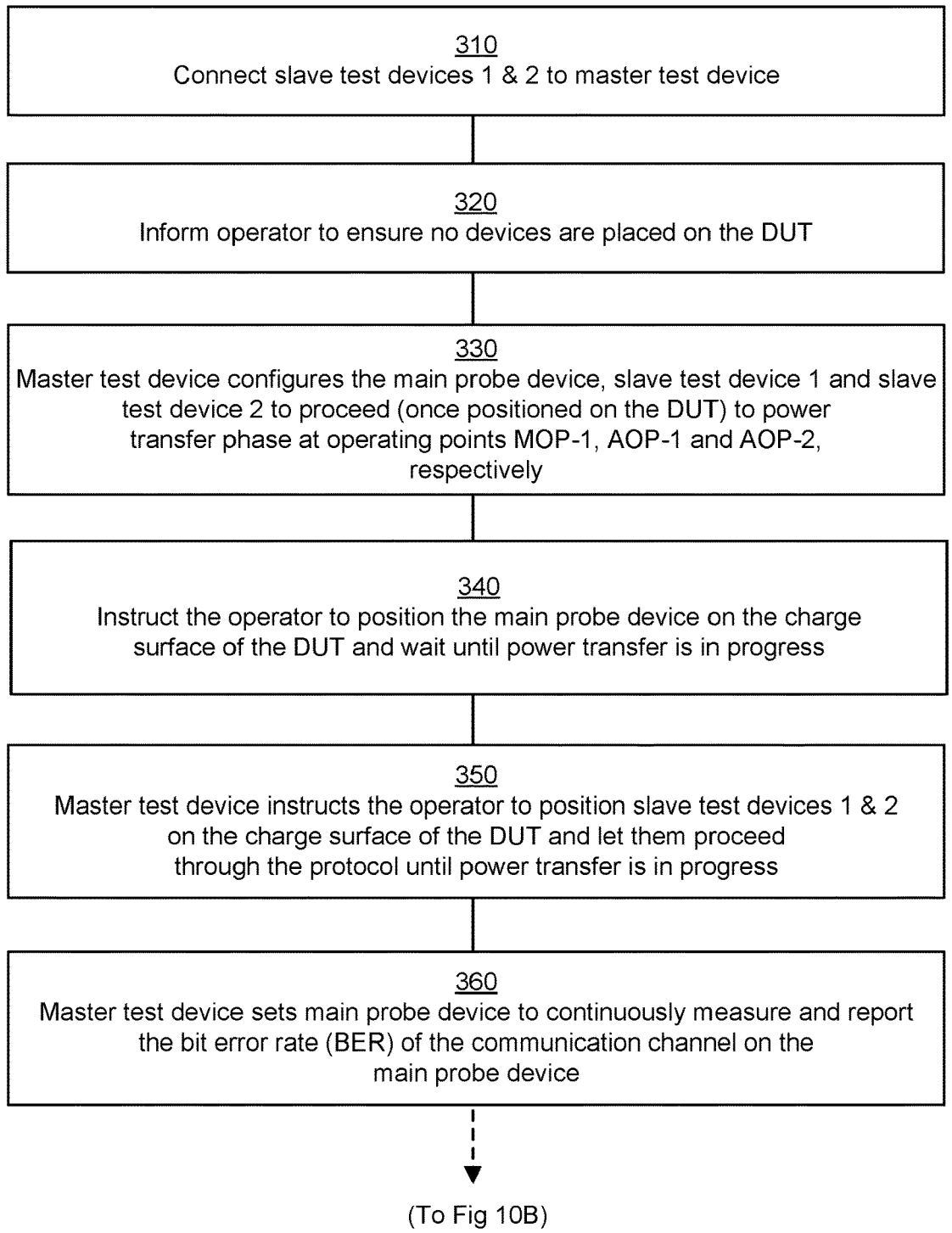
FIGS. 10A-B are two parts that together make up a schematic flowchart diagram of an exemplifying use case.
Figure 10B:
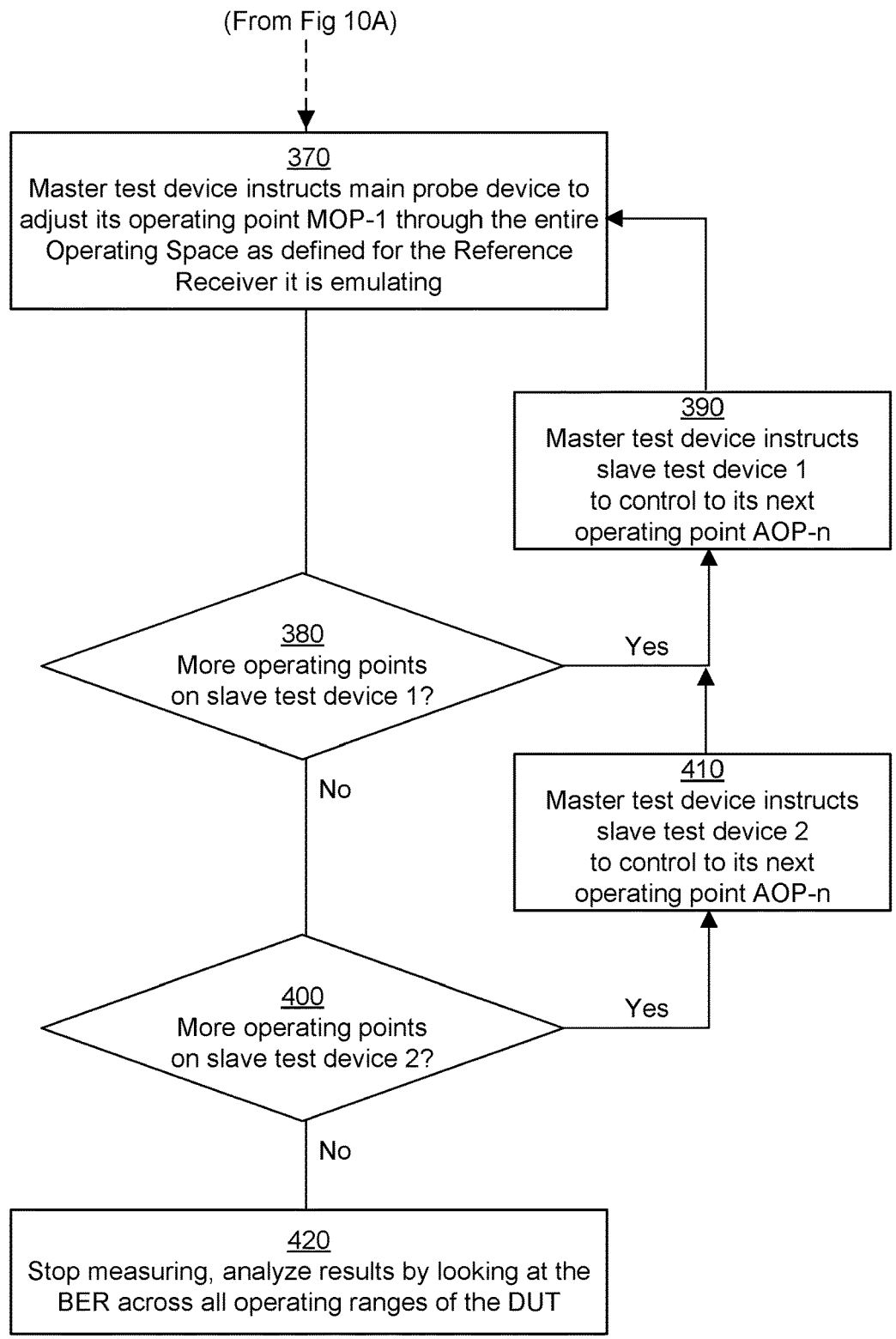

FIGS. 10A-B hence illustrate an exemplifying use case A which pertains to assessing the ability of the wireless power transmitter device 20 under test (the DUT) to maintain a minimum quality level of the in-band communication channel, pursuant to the requirements of the Qi standard. In this particular use case, the wireless power transmitter device 20 has three wireless power transmitters 22*a-n*. To this end, the system 1 uses two slave test devices 30*a-n* (referred to as slave test devices 1 & 2) and one main probe device 31 for testing the wireless power transmitter device 20 and its three wireless power transmitters 22*a-n*.

As seen at 310, an operator (i.e. user) connects slave test devices 1 & 2 to the master test device 40. The master test device 40 informs the operator at 320 to make sure that no devices or foreign objects are placed on the DUT.

At 330, the master test device 40 configures the main probe device, slave test device 1 and slave test device 2 to proceed (once positioned on the DUT) to a power transfer phase at operating points MOP-1, AOP-1 and AOP-2, respectively.

The master test device 40 then, at 340, instructs the operator to position the main probe device on the charge surface of the DUT and wait until power transfer is in progress. Furthermore, at 350, the master test device 40 instructs the operator to position the slave test devices 1 & 2 on the charge surface of the DUT and let them proceed through the protocol until power transfer is in progress.

As seen at 360, the master test device 40 sets the main probe device to continuously measure and report the bit error rate (BER) of the communication channel on the main probe device.

Then, at 370, the master test device 40 instructs the main probe device to adjust its operating point MOP-1 through the entire Operating Space, as defined for the Reference Receiver it is emulating.

A check is made at 380 whether there are more operating points on the slave test device 1. If so, the master test device 40 instructs the slave test device 1 at 390 to control to its next operating point AOP-n. If not, another check is made at 400 whether there are more operating points on the slave test device 2. If so, the master test device 40 instructs the slave test device 2 to control to its next operating point AOP-n at 410.

When all operating points are done with for the slave test devices 1 and 2, measurements are stopped at 420, and the results are analyzed by looking at the BER across all operating ranges of the DUT.

As the reader will have understood already, the present invention also embraces additional inventive aspects in the form of a master test device and a slave test device, respectively. The master test device 40 is for testing of a wireless power transmitter device 20 of a type that has a plurality of wireless power transmitters 22*a-n* adapted for wireless power transfer, and comprises a local data communication interface 41, a master controller 42, and an output unit 43.

The master test device 40 is configured to communicate with a plurality of slave test devices 30*a-n* via the local data communication interface 41. The master controller 42 of the master test device 40 is configured to command 110*a-n* the slave test devices 30*a-n* to perform respective wireless power transfer test procedures 120*a-n* upon respective ones of the wireless power transmitters 22*a-n* of the wireless power transmitter device 20 under test, to receive 140*a-n* result data 125*a-n* from the respective test procedures 120*a-n* performed by the slave test devices 30*a-n*, and to provide 170 an output 45 by the output unit 43 of the master test device 40, the output 45 being based on the respective result data 125*a-n* obtained from the slave test devices 30*a-n*.

The slave test device 30*b*, too, is for testing of a wireless power transmitter device 20 of a type that has a plurality of wireless power transmitters 22*a-n* adapted for wireless power transfer. The slave test device 30*b* comprises a local data communication interface 38*b* being adapted for data communication with a master test device 40, a wireless power receiver 32*b*, and a local controller 37*b* configured for performing a wireless power transfer test procedure 120*b* pertaining to any of the wireless power transmitters 22*a-n* of the wireless power transmitter device 20 under test.

The slave test device 30*b* is configured to communicate via its local data communication interface 38*b* with the master test device 40. The controller 37*b* of the slave test device 30*b* is configured to receive a command 110*b* from the master test device 40, perform the wireless power transfer test procedure 120*b* upon one of the wireless power transmitters 22*a-n*, generate result data 125*b* from the performance of the wireless power transfer test procedure 120*b*, and transmit 130*b* the result data 125*b* to the master test device 40.

The master test device 40 and the slave test device 30*b* can, of course, be included in the system 1 as described above.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A system for testing of wireless power transfer equipment comprising a plurality of wireless power transmitters adapted for concurrent wireless power transfer to respective wireless power receiver devices, the system comprising:
   a master test device having
      a local data communication interface,
      a master controller, and
      an output unit; and
   a number of slave test devices, each slave test device having:
      a local data communication interface being adapted for data communication with the master test device,
      a wireless power receiver, and
      a local controller configured for performing a wireless power transfer test procedure upon any of the wireless power transmitters of the wireless power transfer equipment under test;
   wherein the master test device is configured to communicate via its local data communication interface with the slave test devices; and
   wherein the master controller of the master test device is configured to:
      command the slave test devices to perform their respective test procedures upon respective ones of the wireless power transmitters of the wireless power transfer equipment while being in concurrent operation under test,
      receive result data from the respective test procedures performed by the slave test devices, and
      provide an output by the output unit of the master test device, the output being based on the respective result data obtained from the slave test devices.

2. The system as defined in claim 1, wherein the master controller of the master test device is further configured to:
   analyze the respective result data obtained from the slave test devices; and
   derive a combined test result representing an overall test outcome for the wireless power transfer equipment under test.

3. The system as defined in claim 2, wherein the master controller of the master test device is further configured to:
   analyze the respective result data obtained from the slave test devices; and
   derive an individual test outcome for a particular wireless power transmitter of the wireless power transfer equipment under test.

4. The system as defined in claim 2, wherein the master controller of the master test device is further configured to:
   cause the slave test devices to perform their respective test procedures iteratively, such that the test procedure of a first particular wireless power transmitter of the wireless power transfer equipment under test is performed with an iterative change in a test parameter whereas the test procedure of a second particular wireless power transmitter of the wireless power transfer equipment under test is performed with no such change in the test parameter;
   analyze the respective result data obtained from the slave test devices to correlate the test outcomes of the first and second particular wireless power transmitters; and
   identify, from the correlation, the first particular wireless power transmitter as being a cause of the test outcome of the second particular wireless power transmitter.

5. The system as defined in claim 2, wherein the master controller of the master test device is further configured to:
   analyze the respective result data obtained from the slave test devices;
   determine a modification of a test procedure of one or more of the slave test devices; and
   cause said one or more of the slave test devices to perform their modified test procedures.

6. The system as defined in claim 2, wherein the master controller of the master test device is further configured for testing or measuring a user feedback or indication given by the wireless power transfer equipment when a problem state occurs in connection with the transfer of wireless power by one of the wireless power transmitters, as detected by one of the slave test devices performing its test procedure.

7. The system as defined in claim 2, further comprising:
   a probe device having a wireless power receiver and being under direct operative control by the master controller of the master test device to perform a wireless power transfer test procedure upon any one of the wireless power transmitters of the wireless power transfer equipment under test.

8. The system as defined in claim 2, the master test device further comprising a network communication interface, wherein the master controller of the master test device is further configured for communicating with remote artificial intelligence, machine learning or central knowledge functionality to do one or both of the following:
   a) transmit information to the remote artificial intelligence, machine learning or central knowledge functionality, said information including or being derived from the respective result data obtained from the slave test devices; and
   b) receive information from the remote artificial intelligence, machine learning or central knowledge functionality, said information serving to update one, some or all of the respective test procedures of the slave test devices.

9. The system as defined in claim 2, wherein at least one of the test procedures of the slave test devices involves testing or measuring a parameter indicative of a quality of inductive communication between a slave test device and a wireless power transmitter of the wireless power transfer equipment under test, pursuant to a communication protocol for controlling a wireless power transfer session.

10. The system as defined in claim 2, wherein at least one of the test procedures of the slave test devices involves testing or measuring a parameter indicative of a magnetic field strength during wireless power transfer by a wireless power transmitter of the wireless power transfer equipment under test.

11. The system as defined in claim 2, wherein at least one of the test procedures of the slave test devices involves testing or measuring a parameter indicative of the efficiency of wireless power transfer by a wireless power transmitter of the wireless power transfer equipment under test.

12. The system as defined in claim 2, wherein at least one of the test procedures of the slave test devices involves testing or measuring a parameter indicative of a temperature during wireless power transfer by a wireless power transmitter of the wireless power transfer equipment under test.

13. The system as defined in claim 2, wherein at least one of the test procedures of the slave test devices involves testing or measuring a capability of detecting the presence of a foreign object during wireless power transfer by a wireless power transmitter of the wireless power transfer equipment under test.

14. The system as defined in claim 1, wherein the master controller of the master test device is further configured to:
analyze the respective result data obtained from the slave test devices; and
derive an individual test outcome for a particular wireless power transmitter of the wireless power transfer equipment under test.

15. The system as defined in claim 1, wherein the master controller of the master test device is further configured to:
cause the slave test devices to perform their respective test procedures iteratively, such that the test procedure of a first particular wireless power transmitter of the wireless power transfer equipment under test is performed with an iterative change in a test parameter whereas the test procedure of a second particular wireless power transmitter of the wireless power transfer equipment under test is performed with no such change in the test parameter;
analyze the respective result data obtained from the slave test devices to correlate the test outcomes of the first and second particular wireless power transmitters; and
identify, from the correlation, the first particular wireless power transmitter as being a cause of the test outcome of the second particular wireless power transmitter.

16. The system as defined in claim 1, wherein the master controller of the master test device is further configured to:
analyze the respective result data obtained from the slave test devices;
determine a modification of a test procedure of one or more of the slave test devices; and
cause said one or more of the slave test devices to perform their modified test procedures.

17. The system as defined in claim 1, wherein the master controller of the master test device is further configured for testing or measuring a user feedback or indication given by the wireless power transfer equipment when a problem state occurs in connection with the transfer of wireless power by one of the wireless power transmitters, as detected by one of the slave test devices performing its test procedure.

18. The system as defined in claim 1, further comprising:
a probe device having a wireless power receiver and being under direct operative control by the master controller of the master test device to perform a wireless power transfer test procedure upon any one of the wireless power transmitters of the wireless power transfer equipment under test.

19. The system as defined in claim 1, the master test device further comprising a network communication interface, wherein the master controller of the master test device is further configured for communicating with remote artificial intelligence, machine learning or central knowledge functionality to do one or both of the following:
a) transmit information to the remote artificial intelligence, machine learning or central knowledge functionality, said information including or being derived from the respective result data obtained from the slave test devices; and
b) receive information from the remote artificial intelligence, machine learning or central knowledge functionality, said information serving to update one, some or all of the respective test procedures of the slave test devices.

20. The system as defined in claim 1, wherein at least one of the test procedures of the slave test devices involves testing or measuring a parameter indicative of a quality of inductive communication between a slave test device and a wireless power transmitter of the wireless power transfer equipment under test, pursuant to a communication protocol for controlling a wireless power transfer session.

21. The system as defined in claim 1, wherein at least one of the test procedures of the slave test devices involves testing or measuring a parameter indicative of a magnetic field strength during wireless power transfer by a wireless power transmitter of the wireless power transfer equipment under test.

22. The system as defined in claim 1, wherein at least one of the test procedures of the slave test devices involves testing or measuring a parameter indicative of the efficiency of wireless power transfer by a wireless power transmitter of the wireless power transfer equipment under test.

23. The system as defined in claim 1, wherein at least one of the test procedures of the slave test devices involves testing or measuring a parameter indicative of a temperature during wireless power transfer by a wireless power transmitter of the wireless power transfer equipment under test.

24. The system as defined in claim 1, wherein at least one of the test procedures of the slave test devices involves testing or measuring a capability of detecting the presence of a foreign object during wireless power transfer by a wireless power transmitter of the wireless power transfer equipment under test.

25. A method for testing of wireless power transfer equipment that comprises a plurality of wireless power transmitters adapted for concurrent wireless power transfer to respective wireless power receiver devices, the method comprising:
providing a number of slave test devices;
providing a master test device in communicative connection with the slave test devices;
arranging each slave test device in a position suitable for receiving power from a respective one of the wireless power transmitters of the wireless power transfer equipment under test;

commanding, by the master test device, the slave test devices to perform respective test procedures upon the respective wireless power transmitters while being in concurrent operation;

receiving, by the master test device, result data from the respective test procedures performed by the slave test devices; and providing an output by the master test device, the output being based on the respective result data obtained from the slave test devices.

26. A master test device for testing of wireless power transfer equipment that comprises a plurality of wireless power transmitters adapted for concurrent wireless power transfer to respective wireless power receiver devices, the master test device comprising:

a local data communication interface;

a master controller; and an output unit, wherein the master test device is configured to communicate with a plurality of slave test devices via the local data communication interface; and wherein the master controller of the master test device is configured to:

command the slave test devices to perform respective wireless power transfer test procedures upon respective ones of the wireless power transmitters of the wireless power transfer equipment while being in concurrent operation under test, receive result data from the respective test procedures performed by the slave test devices, and provide an output by the output unit of the master test device, the output being based on the respective result data obtained from the slave test devices.

* * * * *